United States Patent [19]

Currie et al.

[11] Patent Number: 4,504,156

[45] Date of Patent: Mar. 12, 1985

[54] COOLING SYSTEM MONITOR ASSEMBLY AND METHOD

[75] Inventors: Thomas P. Currie, St. Paul; Terry B. Zbinden, Maple Grove, both of Minn.

[73] Assignee: Sperry Corporation, New York, N.Y.

[21] Appl. No.: 395,516

[22] Filed: Jul. 6, 1982

[51] Int. Cl.³ .................... G01K 13/00; G01N 25/18
[52] U.S. Cl. ........................................ 374/45; 62/129; 165/11 R
[58] Field of Search ............ 174/15 R, 16 HS; 340/501, 584, 588, 589, 870.17; 357/28, 40, 51; 374/164, 133, 178; 307/310; 219/501, 505; 338/25, 28; 165/46, 164.33, 11 R; 62/129

[56] References Cited

U.S. PATENT DOCUMENTS

| | | | |
|---|---|---|---|
| 3,882,691 | 5/1975 | Baines et al. | 174/15 R |
| 4,107,019 | 8/1978 | Takao et al. | 357/28 |
| 4,123,938 | 11/1978 | Hamilton | 374/178 |
| 4,155,402 | 5/1979 | Just | 165/46 |
| 4,165,642 | 8/1979 | Lipp | 374/178 |
| 4,322,737 | 3/1982 | Sliwa, Jr. | 357/82 |
| 4,327,399 | 4/1982 | Sasaki et al. | 357/82 |
| 4,356,379 | 10/1982 | Graeme | 219/505 |

OTHER PUBLICATIONS

IEEE Journal of Solid State Circuits, vol. SC-11, No. 6, pp. 784–788, Dec. 1976.

Primary Examiner—Charles Frankfort
Assistant Examiner—W. Morris Worth
Attorney, Agent, or Firm—Charles A. Johnson; Kenneth T. Grace; Marshall M. Truex

[57] ABSTRACT

A cooling system monitoring assembly incorporating a heat generating element for simulating heat generation of components in the system, together with heat sensing element responsive to the heat generating element for providing temperature signals when the temperature of the heat generating element is sensed to have exceeded a predetermined threshold is described, thereby indicating the level of temperature fault. A support assembly is described for supporting the heat generating element in the heat transfer relationship to the monitored cooling system, while supporting the heat sensing element. A system for monitoring a plurality of subassemblies associated with the monitored cooling system and identifying the location of detected temperature fault condition is also described.

6 Claims, 9 Drawing Figures

METAL LAYER 1

METAL LAYER 3

METAL LAYER 2

RESISTOR LAYER 4

METAL LAYER 5

COOLING SYSTEM MONITOR ASSEMBLY AND METHOD

BACKGROUND OF THE INVENTION

1. Field of the Invention

This invention relates generally to a monitor assembly for monitoring the status of a cooling system. More particularly, it relates to an improved monitor assembly and method for monitoring the cooling operation of a cooling system utilized in conjunction with integrated circuit assemblies.

2. State of the Prior Art

The use of cooling systems for removing heat generated by operational systems has long been known. In particular, it has been known to utilized differing types of cooling systems in conjunction with electronic equipment. Through the years, cooling systems have been developed that rely on the flow of air, the flow of other coolant fluids such as water, or the flow of other refrigerants, for transfer and removal of heat energy generated by the system. This use of air flow past electronic circuits provides a relatively simple and straight forward approach to the transfer of heat and the cooling of the electronic circuits in the system. Air flow systems have been known for some time, and it has been recognized that it is desirable to sense the temperature of the air flow stream for attempting to determine that it is at a temperature that will provide adequate cooling. One system of monitoring is to place a thermostat in the stream of air in the vicinity of the air outlet, thereby sensing the temperature of the air after having passed over the electronic components. Mechanical thermostats have a relatively wide-range tolerance, for example in the order of plus or minus three degrees Centigrade. For electronic components that could not tolerate wide temperature ranges of operation, it was necessary to install the components less densely packaged than what otherwise would be allowed for a more precise temperature sensing system. Further, the use of different electronic components within a system often causes a wide range of temperatures within the system due to the differing heat generation characteristics of the various components. As the air flow passed over such differing components, it will be heated accordingly, and the differing air flows are ultimately mixed together at the outlet. Accordingly, when only sensing at the outlet it can be seen that hot spots can occur within the system to the level of causing damage or destructions of electronic components, without necessarily providing a sufficient rise in temperature at the outlet that is capable of being sensed by standard thermostat structures.

As electronic components have been miniaturized, and packaging techniques have led to ever-increasing component densities, the use of air flow for cooling often times does not provide adequate heat transfer. This can be so when the packaging does not permit adequate cooling, even if the air is chilled before entering the system. For example with integrated circuit packages closely packed on printed circuit boards, and the printed circuit boards closely arranged in connector housings, it is often necessary to provide metalic heat exchangers in cooperation with a liquid cooling system. In such systems, it then is important to form a close thermal contact between the components to be cooled and the heat exchanger, thereby permitting the heat to be dissipated into the fluid coolant. Such a cooling system and thermal interface is described in U.S. Pat. No. 4,155,402 to Anthony H. Just, and assigned to the assignee of the present invention. Attempts to monitor the cooling system operation have often involved sensing the fluid temperature at the outlet, or at the manifold, by temperature sensors that sense the fluid temperatures. As previously mentioned, it is recognized that different heat generating components will be often times arranged within the system, and may be tending to cause hot spots. As the coolant fluid passes such hot spots, it will be raised in temperature, but when that coolant fluid is mixed with coolant fluid passing other components, may result in a coolant fluid temperature that does not indicate any overheating. Further, should the coolant fluid passage in any part of the system become blocked, the coolant fluid would not raise in temperature at all while the uncooled components are being totally destroyed for lack of proper cooling.

When monitoring the coolant, whether it be air, water, or some other coolant medium, a detected temperature fault or danger condition normally does not isolate the hot spot, and does not particularly aid in maintenance or evaluation of the problem for correction purposes. As integrated circuits are packed in ever-tighter densities, each replaceable assembly is relatively more complex and expensive for fabrication. Accordingly, it is desirable that each assembly be monitored with regard to temperature fault conditions that could lead to damage or destruction of the assembly. Further, it is desirable to provide a monitoring system that identifies the location of the sensed temperature fault condition as an aid for maintenance and repair, and to minimize down time of the system.

The prior art systems for monitoring operation of cooling systems uniformly have the defficiency of attempting to monitor the temperature of the coolant medium. In electronic equipment that has relatively wide ranges of heat dissipation in different parts of a system, all of which are cooled by a common cooling system, this renders it difficult to derive a monitoring system that will monitor proper operation and cooling at different locations in the systems.

OBJECTS

It is a primary object of the invention to provide improved cooling system monitoring assemblies.

Another object of the inventon is to provide a cooling system monitoring assembly that simulates the heat generation of devices in the system and monitors its cooling for detecting malfunction of the cooling system.

Still a further object of the invention is to provide an improved cooling system monitoring assembly that incorporates a heat generating element in a support member in conjunction with a heat sensing system capable of sensing changes in heat level occurring when the monitoring cooling system fails to adequately dissipate the heat generated.

Still a further object of the invention is to provide an improved cooling system monitoring system that can be advantageously utilized with many assemblies of components within a system.

Another object of the invention is to provide an improved cooling system monitoring assembly that identifies the location of the detected temperature fault condition.

SUMMARY OF THE INVENTION

In view of the foregoing, the present invention provides an improved cooling system monitoring assembly that incorporates an integral heat generating element that simulates the heat generation of components in the system, and a temperature sensing element for sensing the temperature of the heat generating element and providing signals indicative of sensed temperatures, thereby indicating the effectiveness of the monitored cooling system. The heat generating element is arranged in a support member to be held in heat conducting association with the cooling system, and the heat sensing element being supported in electrically insulated cooperative relation to the heat generating element and responsive thereto. The invention contemplates utilizing a cooling system monitoring assembly in conjunction with several or all of the subassemblies within the system being cooled by the monitored cooling system, and includes a temperature fault identification system for providing an indication as to which subassembly monitored the temperature fault condition.

The foregoing stated objectives and other more detailed objectives will become apparent from a consideration of the drawings when taken together with the description of a preferred embodiment.

DESCRIPTION OF THE PREFERRED EMBODIMENT

Figure 1:
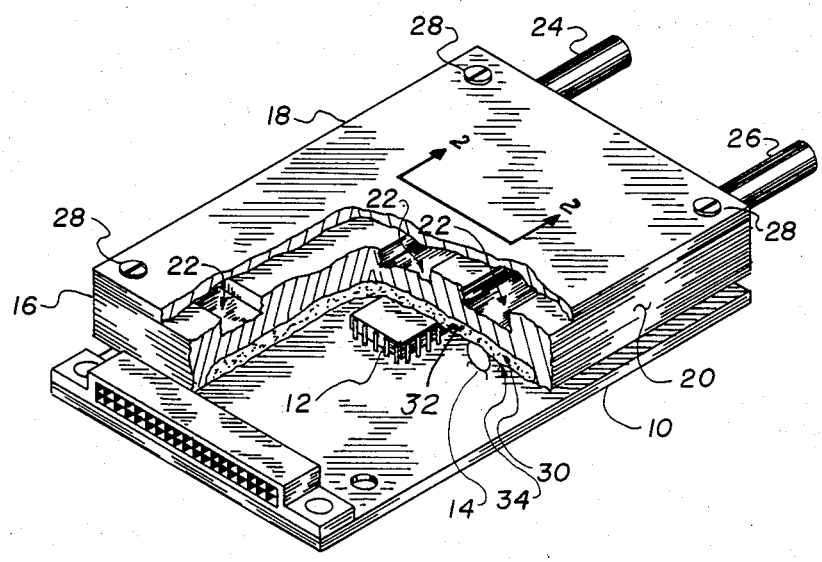
FIG. 1 is a three dimensional view of a modular package, comprised of a printed circuit board assembly, mounted components, and a cold plate assembly for having a coolant fluid flowing therethrough, with a compliant mat for making thermal contact between components and the cold plate assembly.

FIG. 1 is a three dimensional view of a modular package, comprised of a printed circuit board assembly, mounted components, and a cold plate assembly for having a coolant fluid flowing therethrough, with a compliant mat for making thermal contact between the components and the cold plate assembly. The printed circuit assembly 10 can be comprised of a plurality of layers of printed circuit boards arranged for making electrical interconnection for integrated circuit packages 12 and components 14. A cold plate assembly 16 is constructed of a backing plate 18, and a channeled cooling plate 20. The cold plate assembly 16 elements are constructed of materials exhibiting good heat conducting properties, such as aluminum or copper. The channeled cooling plate 20 has a serpentine channel 22 (shown exposed) with opening in fluid communication with ports 24 and 26. These ports are arranged to be coupled to a manifold (not shown) that supplies the coolant fluid at one of the ports and convey the output coolant fluid received from the other port, after the coolant fluid has circulated through channel 22. Plate 18 is secured to the cooling plate 20, for example by screws 28. A recessed area 30 is formed in one surface of cooling plate 20 to receive a heat conductive paste 32 of the type described in the patent to Just, identified above. An electrically insulative film 34 is placed over the paste and attached to the exposed surfaces of cooling plate 20. The paste 32 and the film 34 form a compliant mat for making heat conductive contacts with the circuit elements. The cooling fluid circulates through ports 24 and 26 and channel 22. Heat is conducted through the compliant mat through the cooling plate 20, and into the circulating fluid which removes it from the system. The heat sensing element will be in contact with the compliant mat and will be described in detail below.

Figure 2:
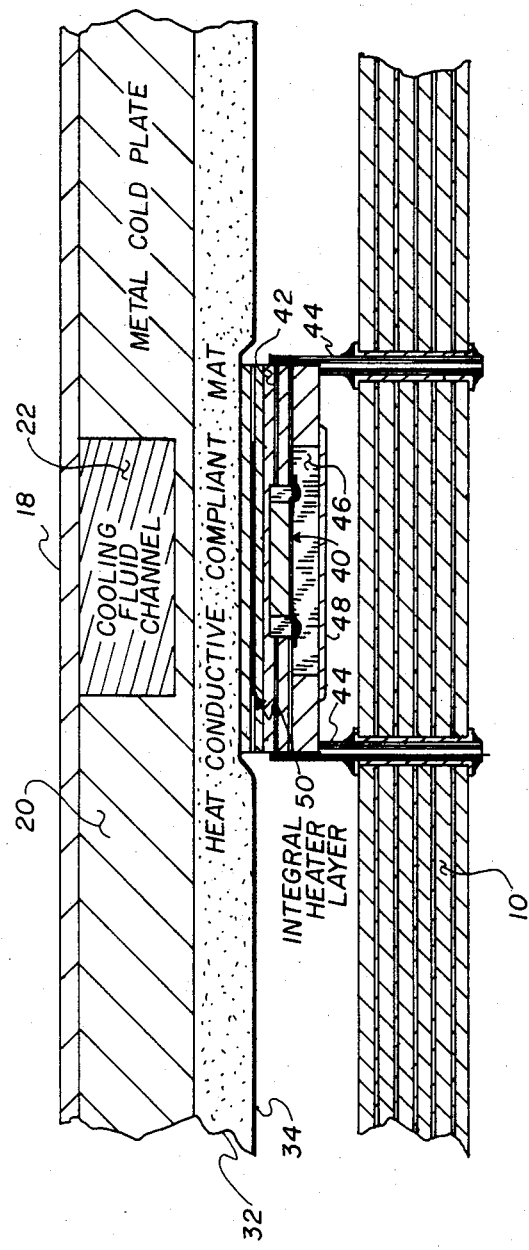
FIG. 2 is a sectional elevation view taken along lines 2—2 in FIG. 1, and illustrates the relationship of a mounted sensing element and its associated cold plate assembly.

FIG. 2 is a sectional elevation view taken along line 2—2 in FIG. 1, and illustrated the relationship of a mounted sensing element and its associated cold plate assembly. The sensing element 40 is an intergrated circuit and is mounted to an integrated circuit carrier 42. The carrier is comprised of a plurality of layers of alumina ceramic, each having a pattern of conductive material coating thereon, as will be described in more detail below. Edge connection pins 44 make electrical contact with conductive elements on the carrier 42, and with the printed circuit board assembly 10. The cavity 46 in which the sensing element 40 is positioned, is enclosed by cover 48. The carrier 42 has one layer of conductive material 50 that becomes an integral heater when coupled to a source of power. The heater 50 is selected to have a resistance level that will provide adequate heat to be sensed by the associated sensing element 40 when coupled in the operating system. A typical resistance level will be selected to be 20 ohms at 100° Centigrade, with a tolerance of plus or minus 10%. In a manner that will be described in more detail below, the sensing element 40 functions to sense the temperature caused by heater 50, and to provide a signal indicative of the sensed temperature level. The output signals can be utilized in a variety of ways, for example to initiate turning power off when temperature exceeds a predetermined threshold, to initiate a warning signal when the temperature is sensed to exceed a predetermined threshold level, and to convert the sensed temperature signals to a form that can be evaluated by the associated data processing system. Thus the range of options can extend from initating immediate action to taking no action other than to provide data that can be evaluated.

Elements that have previously been described will have the same reference numerals applied when illustrated or described.

FIG. 3a through FIG. 3e comprise illustrative plan views of conductive metal layers utilized in the layers of carrier 42. The layers are deposited on alumina ceramic substrate material by techniques known in the art, and the layers are stacked and co-fired, again by techniques known in the art. The co-fired layers are fused and the carrier 42 becomes an integral structure.

Figure 3A:
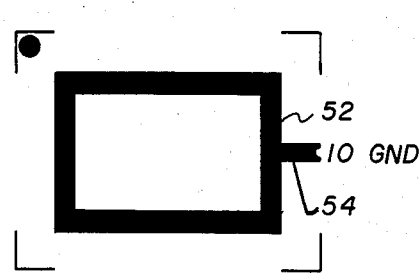
FIG. 3a is an illustrative plan view of a first metalic layer for making a ground connection.

FIG. 3a illustrates a first metalic layer 52 that is utilized for making connection through tab 54 to ground potential.

Figure 3C:
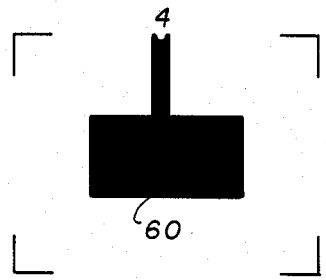
FIG. 3c is an illustrative plan view of a third metalic layer for making contact with at least a portion of an integrated circuit sensing device.
Figure 3B:
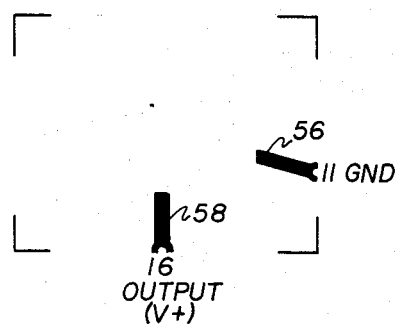
FIG. 3b is an illustrative plan view of a second metalic layer for making output connections.

FIG. 3b illustrates a second metalic layer comprised of tab 56 for connecting an associated integrated circuit to ground potential, and tab 58 for connecting the output signals of an associated sensing circuit to the printed circuit board assembly.

FIG. 3c illustrates a third metalic layer 60 for forming a coupling to a sensing circuit.

Figure 3D:
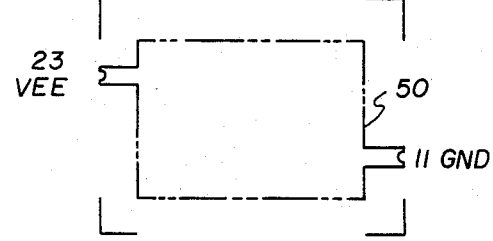
FIG. 3d is an illustrative plan view of a fourth metalic layer comprising a resistive element for generating heat when power is applied thereto.

FIG. 3d illustrates a fourth metalic layer 50 that comprises the resistive element for generating heat when power is applied thereto. The configuration of resistive element 50 is characteristically selected to provide heat over a relatively large portion of the carrier. It can be a serpentine strip of resistive material, or can be a sheet of resistive material.

Figure 3E:
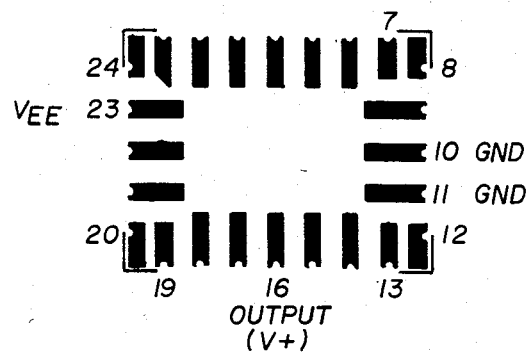
FIG. 3e is an illustrative plan view of a fifth metalic layer for making power and signal connections to an associated integrated circuit.

FIG. 3e illustrates a fifth metalic layer that comprises an array of a plurality of connection tabs for making electrical connections to terminals of an associated integrated circuits' sensing element.

Connection between layers is accomplished by plated-through holes in combination with vertical conductive pins inserted therein. Three dimensional interconnections of this type are well-known. It should be understood that the illustrative configurations of the plurality of metalic layer can be altered to accommodate different configurations of integrated circuit packages as well as different configurations of pin connections. The metalic layers are electrically insulated from one another by the ceramic layers, with electrical interconnection only being accomplished through the interconnecting conductive pins.

Figure 4:
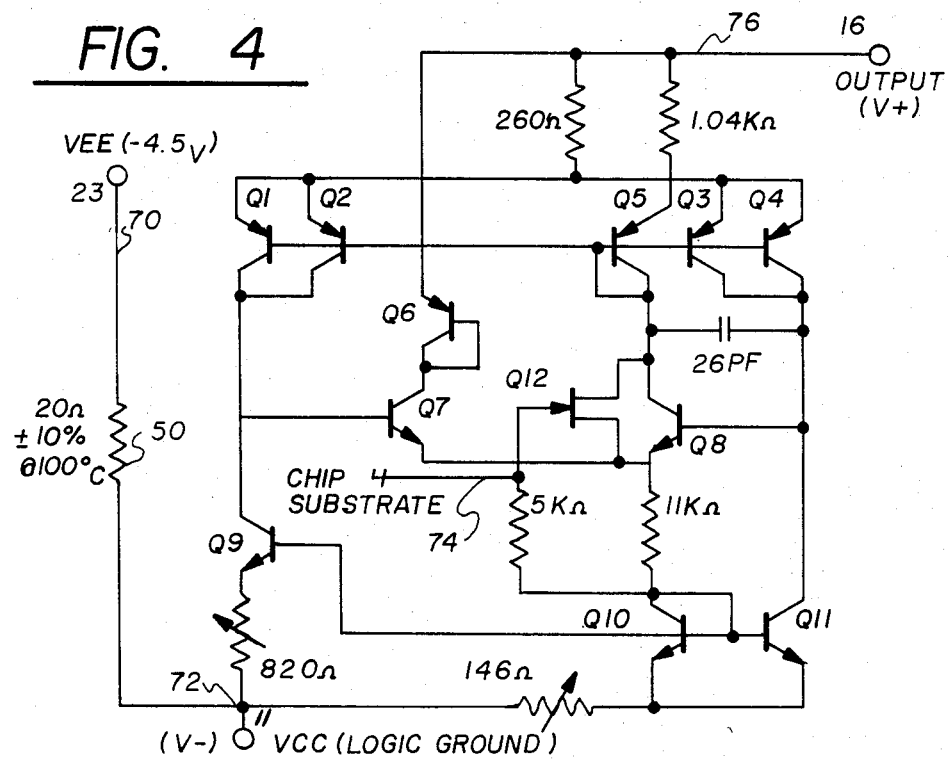
FIG. 4 is a schematic circuit diagram of a sensing circuit that provides output signal levels indicative of sensed temperature levels.

FIG. 4 is a schematic circuit diagram of an integrated sensing circuit 40 that provides output signal levels indicative of sensed temperature levels. A sensing circuit of this type is available commercially, and is identified as an industry type 590J integrated circuit chip. For example, this type of circuit can be obtained from Annalog Devices identified as part number AD590J. Physically the die is 0.062 inch by 0.037 inch by 0.020 inch, and is configured to have a backing of silicon. With reference to the schematic diagram, the heat generating resistive element 50 has one terminal coupled to pin 23 via line 70 for receiving power, which for this configuration is nominally −4.5 volts, and a second terminal coupled to junction 72 which in turn is coupled to pin 11 for coupling to logic ground. The circuit is coupled to the chip substrate by line 74 which couples to pin 4. The output signals are provided on line 76 to pin 16. The active elements are designated Q1 through Q12, and the passive elements have component values set forth adjacent to each of them.

The detail functional operation of the circuit will not be described, it being sufficient to understand that the circuit provides an output current that is proportional to the absolute temperature. That is, the output current is one microampere per degree Kelvin. This translates such that the current output of 298.2 microamperes equal 298.2° K. Calibration error would be the difference between the indicated temperature as measured by the output current and the actual absolute temperature.

The sensing circuit is intended to operate in a system, and should meet the operating conditions in the range of −55° C. to 150° C. At −55° C. the output current should be 212.7 microamperes minimum and 223.7 microamperes maximum. At the upper extreme of 150° C., the output current should be in the range 417.7 microamperes minimum to 428.7 microamperes maximum. At 25° C. the output current should be within the range of 295.7 microamperes minimum to 300.7 microamperes maximum. The optimum operating range for this embodiment is in the range of 25° C. to 125° C. At this level of temperature the calibration error should be within the range of plus or minus 2.5° C. maximum and the nonlinearity should be 0° C. maximum. It should be understood that the sensing circuit described finds particular advantage due to its size, minimal power requirements, and linearity of temperature identification. Other circuits that can sense temperature fluctuations in a coolant fluid by sensing the temperature fluctuation of an associated heating element could also be used.

Figure 5:
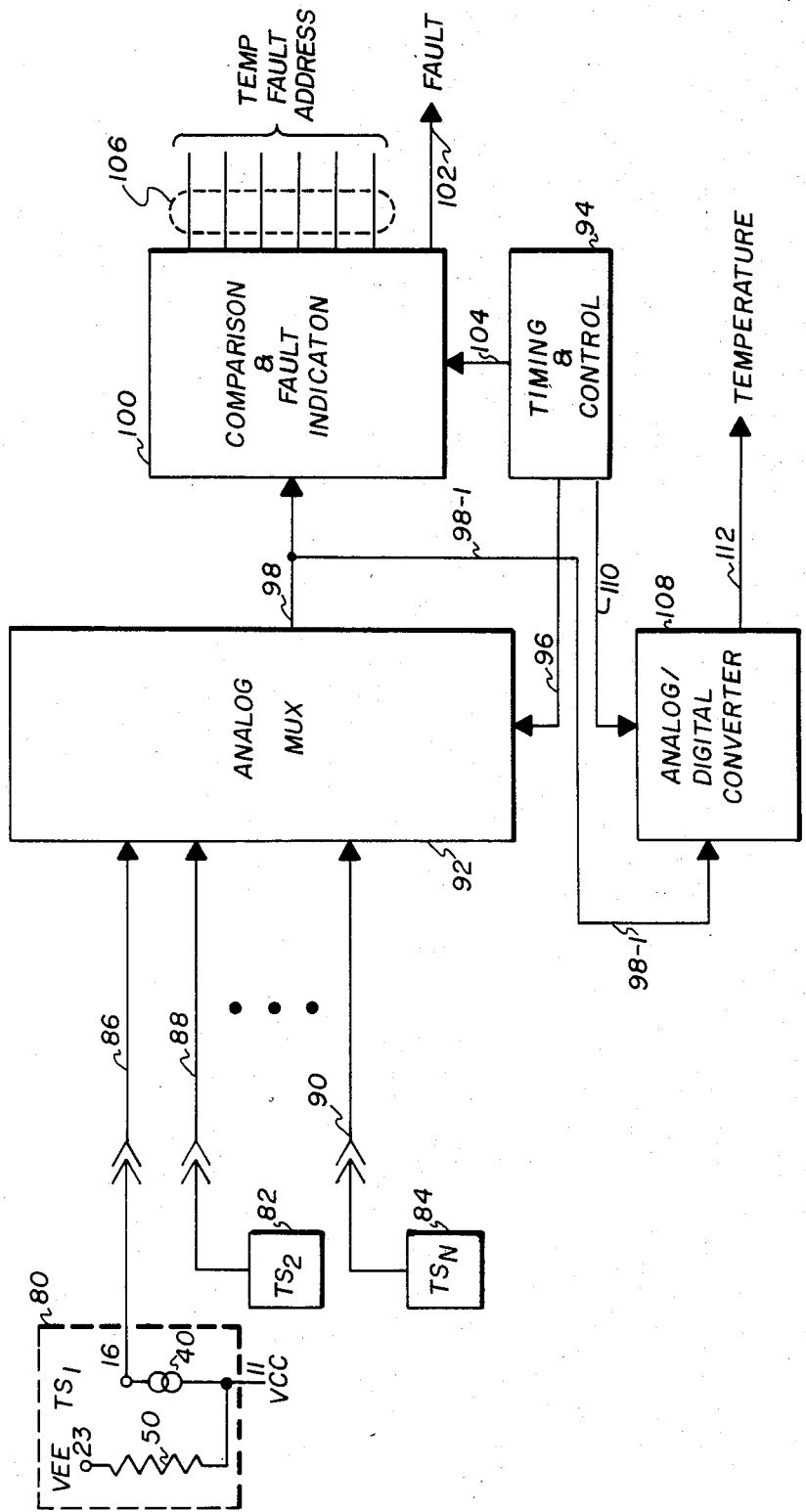
FIG. 5 is a block diagram illustrating a system for sensing and indicating temperature conditions on identified subassemblies.

FIG. 5 is a block diagram illustrating a system for identifying temperature conditions on identified subassemblies. A Temperature Sensing element labeled TS1 is shown enclosed in dashed block 80, and is comprised of the resistive element 50 and the sensing circuit 40, as previously described. Similar Temperature Sensing elements TS2 labeled 82, and TSn labeled 84, illustrate that a plurality of Temperature Sensing elements can be utilized in a system. Each of the Temperature Sensing elements is characteristically associated with a separate electronic subassembly. The analog signals indicative of the sensed temperature conditions on the respective subassemblies are directed on lines 86, 88, 90 to analog multiplexer 92. The Timing and Control 94 controls Analog Multiplexer 92 by signals on line 96, and causes the selected analog temperature signal for the selected subassembly to be issued on line 98 to the Comparison and Fault Indication circuit 100. The comparison can be against a threshold signal level, that when exceeded, causes a fault signal to be issued on line 102 under control of Timing Control Signals provided on line 104. As previously indicated, the fault identification can be of a fixed level such that when the temperature is sensed to exceed a threshold level, the fault signal is issued and caused immediate reaction. Alternatively, multiple thresholds can be established with multiple fault indication lines providing an indication of different levels of temperature conditions. When a fault condition is detected, the Timing Control 94 causes the Comparison and Fault Indication circuit 100 to issue signals on lines 106 indicative of the identification of the subassembly being evaluated, thereby providing an aid to maintenance and repair.

For use in digital systems, it is often desirable to have the temperature expressed as a digital number. In this regard, the Temperature Sensors 80, 82, and 84 can be utilized to provide selected analog temperature signals on line 98-1 to an Analog/Digital Converter 108. This converter operates under control of Timing Control 94 signals provided on line 110 to convert the appropriate analog temperature signal to a digital word that is provided on line 112. The digital temperature can then be stored or otherwise utilized by a digital equipment in manners that are well known.

The system of temperature evaluation, address generation and temperature conversion is constructed from components available commercially, and an example system is described in detail in co-pending application of T. B. Zbinden, Ser. No. 395,511, filed July 6, 1982, and assigned to the assignee of this invention. From the foregoing description, it can be seen that the objectives of the invention have been achieved. The integrated circuit carrier having an integral heating element for use in conjunction with a sensing circuit, provides a means whereby the effectiveness of a cooling system can be monitored at each printed circuit assembly. The temperature level is specified for each sensing assembly and can be utilized to identify temperature fault locations, as well as providing signals indicative of the sensed temperature levels. Having satisfied the various stated purposes and objectives of the invention, and without departing from the spirit and scope of the invention, what is intended to be protected by Letters Patent is set forth in the appended claims.

We claim:

1. An improved integrated circuit package comprising:

support means for supporting a temperature sensing integrated circuit, said support means including a plurality of ceramic support members each having a predetermined pattern of electrically conductive materials deposited on at least portions thereof, and one ceramic support member having integral resistive heat generating means deposited thereon and electrically insulated from the others of said electrically conductive materials, and selected ones of said plurality of ceramic support members having apertures formed therein, and said plurality of ceramic support members and said one ceramic support member arranged in predetermined layers and co-fired to form a unitary integral body having a cavity formed by said apertures for receiving and mounting the temperature sensing integrated circuit;

electrical interconnection means coupled to predetermined associated ones of said electrically conductive materials on said plurality of ceramic support members for making interconnection between a supported temperature sensing integrated circuit and pins to be associated therewith for conducting signals indicative of temperature levels sensed by the supported temperature sensing integrated circuit;

and power receiving means coupled to said integral resistive heat generating means for receiving power for causing said integral resistive heat generating means to operate for generating a predetermined reference level of heat to be removed, said predetermined reference level of heat selected for simulating a level of heat to be safely dissipated by an associated cooling system.

2. An improved integrated circuit package as in claim 1 and further including:

temperature sensing integrated circuit means electrically and thermally coupled to said support means and supported in said cavity for sensing the temperature of said integral resistive heat generating means and for providing output signals indicative of the sensed temperature.

3. The combination of claim 2 and further including in combination:

conversion means responsively coupled to temperature sensing integrated circuit element for converting said output signals to a binary representation thereof.

4. For use in electronic equipment having a cooling system for cooling electronic components mounted on a subassembly, a cooling system monitor supported by said subassembly comprising:

integral resistive heat generating means for generating heat at a predetermined reference level of heat to be dissipated by the cooling system from an area of the subassembly, said predetermined reference level of heat selected for simulating a level of heat generated by selected ones of the electronic components;

heat sensing means responsively coupled to said integral resistive heat generating means for sensing the heat of said integral resistive heat generating means and for providing a fault signal when said reference level of heat rises above a said predetermined reference level of heat indicative that said cooling system is not adequately dissipating said heat from the area of the subassembly, said heat sensing means including integrated circuit temperature sensing circuit means for providing output signals of predetermined levels per degree of absolute temperature of said integral resistive heat generation means sensed; and support means for mounting said integral resistive heat generating means and said heat sensing means in cooperative relationship to each other and to the cooling system being monitored, said support means including a plurality of support members each having a predetermined pattern of electrically conductive material deposited on at least portions thereof, and one support member having said integral resistive heat generating means deposited thereon with selected ones of said support members having apertures formed therein, said plurality of support members and said one support member arranged in layers and formed as a unitary body having a cavity formed by said apertures for receiving said heat sensing means.

5. A cooling system monitor comprising:

subassembly means for supporting electronic components;

a plurality of electronic components mounted on said subassembly means;

a source of coolant fluid;

cold plate means mounted on said subassembly means in heat conductive relation to said plurality of electronic components and having a coolant channel therein in fluid communication with inlet and outlet ports coupled to said source of coolant fluid for removing heat from said plurality of electronic components to coolant flowing in said channel;

integral resistive heat generating means for generating a predetermined reference level of heat to be removed by said coolant, said predetermined reference level of heat selected for simulating a level of heat generated by selected ones of said electronic components;

support means mounted on said subassembly means having a plurality of support members each having a layer in a predetermined pattern of electrically conductive materials deposited on at least portions thereof, wherein said integral resistive heat generating means includes electrically conductive means deposited on one of said support members, and selected ones of said support members having apertures formed therein, said support members and layers positioned and contructed in a unitary body having a cavity formed by said apertures; and integrated circuit temperature sensing means mounted in said cavity for sensing the temperature of said integral resistive heat generating means and for providing output signals of predetermined current increments per degree of temperature sensed, wherein levels of temperature above said predetermined reference level of heat are indicative of failure of said coolant to adequately remove heat from said plurality of electronic components on said subassembly means.

6. A cooling system monitor as in claim 5 and further including:

converting means for converting said output signals to binary representations thereof.

* * * * *

UNITED STATES PATENT AND TRADEMARK OFFICE
CERTIFICATE OF CORRECTION

PATENT NO. : 4,504,156
DATED : March 12, 1985
INVENTOR(S) : Thomas P. Currie, Terry B. Zbinden It is certified that error appears in the above–identified patent and that said Letters Patent are hereby corrected as shown below:

Claim #5, Column #8, Line #67, "contructed" should be -- constructed --.

Signed and Sealed this

Sixteenth Day of July 1985

[SEAL]

Attest:

DONALD J. QUIGG

*Attesting Officer*  *Acting Commissioner of Patents and Trademarks*